(12) United States Patent
Kim

(10) Patent No.: US 7,457,130 B2
(45) Date of Patent: Nov. 25, 2008

(54) PACKAGING FOR PLASMA DISPLAY MODULE

(75) Inventor: Myoung-Kon Kim, Suwon-si (KR)

(73) Assignee: Samsung SDI Co., Ltd., Suwon-si (KR)

( * ) Notice: Subject to any disclaimer, the term of this patent is extended or adjusted under 35 U.S.C. 154(b) by 490 days.

(21) Appl. No.: 10/930,412

(22) Filed: Aug. 31, 2004

(65) Prior Publication Data

US 2005/0052827 A1    Mar. 10, 2005

(30) Foreign Application Priority Data

Sep. 8, 2003    (KR) .................... 10-2003-0062750

(51) Int. Cl.
*H05K 1/00*    (2006.01)
(52) U.S. Cl. .................... 361/748; 174/250
(58) Field of Classification Search ........... 206/305, 206/307, 320, 497, 709, 719, 775, 829; 361/681, 361/752, 790, 808, 810, 748; 174/250
See application file for complete search history.

(56) References Cited

U.S. PATENT DOCUMENTS

| | | | | |
|---|---|---|---|---|
| 3,836,704 | A | * | 9/1974 | Coules .................... 174/138 D |
| 4,718,629 | A | * | 1/1988 | Block et al. .................. 248/363 |
| 4,750,617 | A | * | 6/1988 | Anderson et al. ......... 206/315.6 |
| 4,969,065 | A | * | 11/1990 | Petri ........................... 361/804 |
| 5,441,150 | A | * | 8/1995 | Ma ............................. 206/707 |
| 6,390,296 | B1 | * | 5/2002 | Griffith et al. ................ 206/320 |
| 6,839,240 | B2 | * | 1/2005 | Skofljanec et al. .......... 361/752 |
| 2002/0159240 | A1 | | 10/2002 | Watanabe et al. |
| 2003/0169573 | A1 | * | 9/2003 | Irie et al. ..................... 361/752 |
| 2004/0055928 | A1 | * | 3/2004 | Smith .......................... 206/586 |
| 2004/0232298 | A1 | * | 11/2004 | Bremmon et al. ....... 248/281.11 |

FOREIGN PATENT DOCUMENTS

| | | |
|---|---|---|
| CN | 1378968 A | 11/2002 |
| JP | 10-194344 | 7/1998 |
| JP | 2002-302156 | 10/2002 |
| JP | 2002-302187 | 10/2002 |
| JP | 2002-302193 | * 10/2002 |

(Continued)

OTHER PUBLICATIONS

Patent Abstract of Japan, Publication No. 2002-302156, Published on Oct. 15, 2002, in the name of Togo et al.

(Continued)

*Primary Examiner*—Dean A. Reichard
*Assistant Examiner*—Yuriy Semenenko
(74) *Attorney, Agent, or Firm*—Christie, Parker & Hale, LLP

(57) ABSTRACT

Packaging for a display module which is easy to install due to a simple structure, and protects the front, sides and back of the display module securely. The packaging includes a protective plate attached to the back of the panel module. The panel module includes a display panel, a chassis member and one or more circuit boards. The protective plate protects the back and sides of the panel module. The packaging also includes spacers placed between the protective plate and the chassis of the panel module and compensate for the clearance between the protective plate and the chassis of the panel module.

22 Claims, 8 Drawing Sheets

FOREIGN PATENT DOCUMENTS

KR    2003-0008996    1/2003

OTHER PUBLICATIONS

Patent Abstract of Japan, Publication No. 2002-302187, Published on Oct. 15, 2002, in the name of Togo et al.

Patent Abstract of Japan, Publication No. 2002-302193, Published on Oct. 15, 2002, in the name of Watabe et al.

Korean Patent Abstracts for Publication No. 102003008996, Date of publication of application Jan. 29, 2003, in the name of Dong A. Kim et al.

* cited by examiner

PACKAGING FOR PLASMA DISPLAY MODULE

CROSS-REFERENCE TO RELATED APPLICATION

This application claims priority to and the benefit of Korean Patent Application No. 10-2003-0062750 filed on Sep. 8, 2003 in the Korean Intellectual Property Office, the entire content of which is incorporated herein by reference.

BACKGROUND OF THE INVENTION (a) Field of the Invention

The present invention relates to packaging for display units, and in particular, to a lightweight and thin plasma display apparatus with a large screen, and to packaging for packing the plasma display unit including a plasma display module.

(b) Description of the Related Art

In general, plasma display units are light emitting devices which include two glass substrates sandwiched together and sealed to each other, and which display an image using a gas discharge between the glass substrates. Plasma display units have many applications, such as a television, a monitor and an advertising display used outdoors, and these apparatus has received much attention as a direct-view image display with a large screen for the High Definition Television (HDTV) era due to its favorable features such as its fast response, its easy enlargement of the screen, and its simple manufacturing process resulting from the lack of a need for an active element in each cell.

Plasma display units are usually classified into alternating current (AC) types and direct current (DC) types with respect to driving power, and surface discharge types and face discharge types with respect to gas discharge. At present, AC and surface discharge type plasma display apparatus are dominant because of their higher resolution, larger screen size and simpler manufacturing.

A plasma display unit includes a plasma display panel (hereinafter referred to as "PDP") having a pair of transparent glass substrates facing each other to form discharge spaces; and having groups of electrodes placed thereon. A chassis member supports the PDP. A driving circuit board is attached to the chassis member for sending signals to the PDP. Such a plasma display unit may also be housed in a main case.

In contrast to other display devices, it is necessary to consider a way to transport the panel module which has large glass substrates as the main components.

Recently, sizes of PDP's has increased and manufacturing these large PDP's requires a large-scale facility. Thus, PDP manufacturers produce the panel module only while plasma display unit manufacturers compile plasma display units by adding other circuit blocks purchased from PDP manufacturers to the panel module, and assembling them into the main case.

During the transport of PDP's from the PDP manufacturer to the plasma display unit manufacturer, it is important that measures be taken to avoid damage by shock during the transport.

Japanese Laid Open Patent Publication Nos. 2002-302156, 2002-302187 and 2002-302193 disclose packaging structures for transporting a panel module including installing a module support plate made of corrugated cardboard to the back of the PDP module, the cardboard being larger than the outer dimensions of the panel module and covering the panel module. The module support plate is installed by using supporting means having a grooved floor and an outer edge fitted to the size of the PDP. Additionally, a frontal protective cover made of resin is used, the cover being approximately the same size or larger than the frontal frame of the plasma display module. The frontal protective cover contains an antistatic substance to protect the flexible printed circuit (FPC).

The aforementioned prior art uses a variety of means to protect the front, sides and back of the module, which is expensive, and requires much time to install because of its complicated structure.

SUMMARY OF THE INVENTION

In accordance with the present invention, packaging for a plasma display module is provided wherein the packaging is easy to install due to its simple structure. The packaging is designed to protect the front, sides and back of the plasma display module.

Further in accordance with the present invention, packaging for a plasma display module is provided that is adaptable to modules of various sizes.

In an exemplary embodiment of the present invention, packaging for a plasma display module includes a PDP, a chassis member, and a protective plate encompassing and protecting the back and the sides of the PDP module having a circuit board.

The protective plate may have bolting holes and may be fixed to bosses of the chassis member by bolts or other attachment means.

Also, the protective plate may have sidewalls formed along its periphery extending toward the PDP. The edges of the sidewalls may protrude a predetermined length over the front of the panel. When attached to the panel module, the inner surface of the sidewalls of the protective plate may be spaced from the panel by a predetermined gap.

In one exemplary embodiment, a plurality of reinforcing ribs may be formed on the back of the protective plate. Moreover, jigging holes to move the protective plate and/or attaching planes for vacuum pads may be formed on some places on the front of the protective plate.

The protective plate may be made of a plastic material and may also contain an antistatic substance.

Another exemplary embodiment of the present invention may also include spacers that are positioned between the protective plate and the chassis member of the panel module to adjust clearance. In a further embodiment the spacer may be attachable to and releasable from the protective plate without a special connecting means such as a screw. Therefore, a releasable hook may be formed on one side of the spacer, and an inserting hole for the hook may be formed on the protective plate.

In addition, the packaging for the plasma display module may include an antistatic plastic sheet placed at the back of the protective plate or one that covers the whole panel module, including protective plate.

Additionally, in order for the packaging to hold the panel module with the protective plate attached thereto, other exemplary embodiments of the present invention provide for individual packaging for a single panel module and bundle packaging for a plurality of panel modules.

For individual packaging, an exemplary embodiment of the present invention includes first and second shock absorbing means with a slot in each means, each shock absorbing means formed substantially identically in shape to a corner of the protective plate to be fitted therein, a first box that the first shock absorbing means may be placed; and a second box encompassing at least an external edge of the first box.

In another exemplary embodiment, the boxes are larger in width than the shock absorbing means. The first and second shock absorbing means may have supporting ribs formed on the sides thereof to contact the inner surface of the boxes and to create a space between the shock absorbing means and the boxes for anti-shaking properties.

For bundle packaging the structure may include a first box, first shock absorbing means which may be placed in the first box and may have a plurality of slots positioned apart from each other with a predetermined space on each of the first shock absorbing means and formed substantially identically in shape to an end of the protective plate to be fitted therein, second shock absorbing means which are substantially identical in shape to the first shock absorbing means to fit an end of the protective plate into the slot, a second box which may encompass the second shock absorbing means and a side cover encompassing the plurality of protective plates and being located between and contacting a first box external edge and a second box external edge.

The shock absorbing means may be made from expanded polypropylene (EPP) which is foamed polypropylene with grains formed by physical foaming instead of chemical foaming.

DETAILED DESCRIPTION

Figure 1:
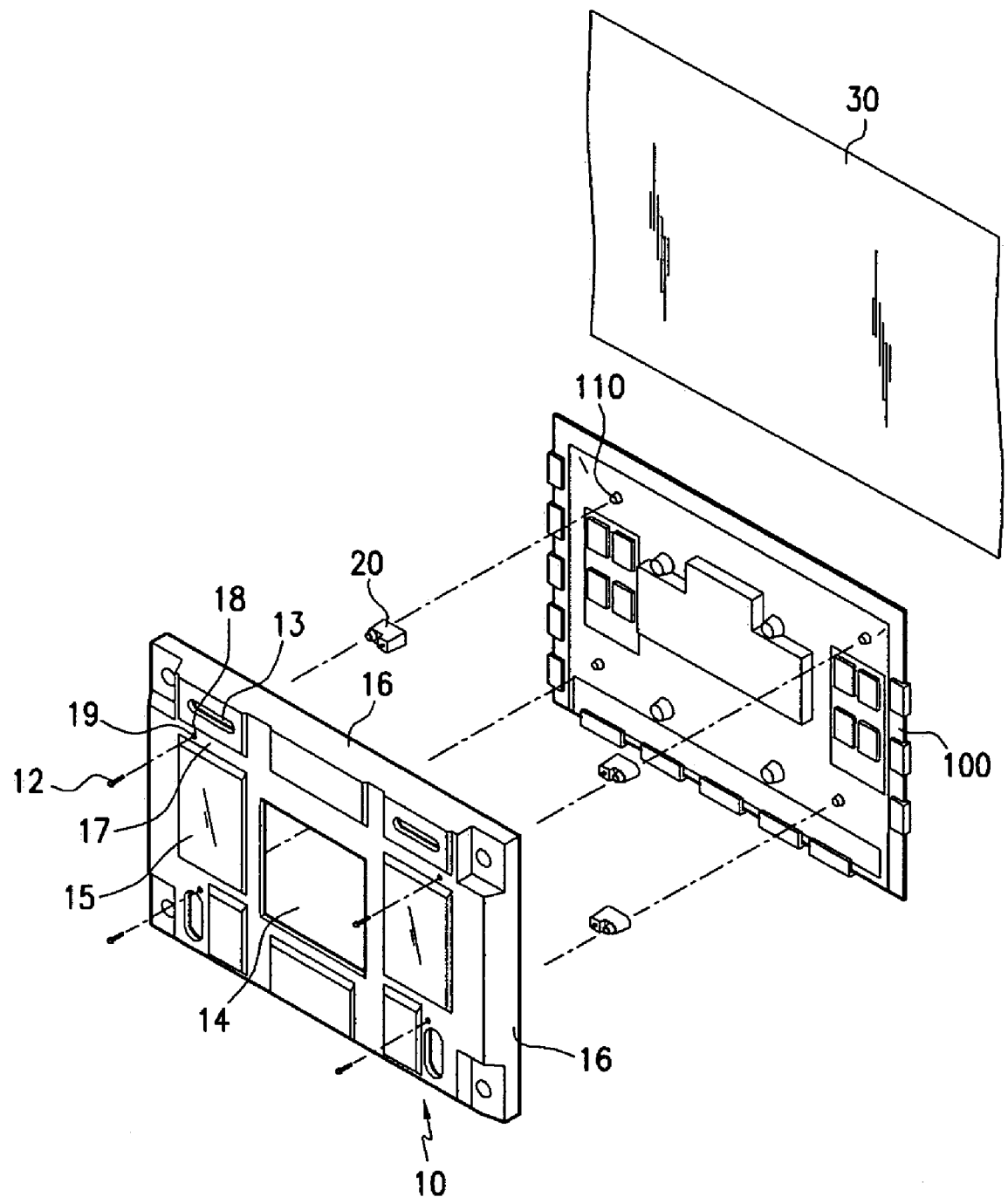
FIG. 1 is a perspective view of a packaging for a PDP according to an exemplary embodiment of the present invention.
Figure 2:
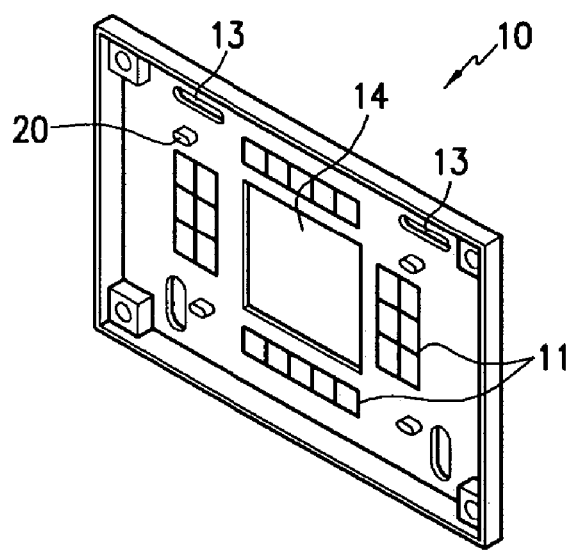
FIG. 2 is a perspective view of the back of packaging for a PDP according to an exemplary embodiment of the present invention.

As shown in FIG. 1, in an exemplary embodiment of the present invention, a protective plate 10 is in a hull shape to accommodate the panel module 100. As shown in FIG. 2, a plurality of ribs 11 are formed on the back of the protective plate 10 to add the strength thereof, and spacers 20 are attached to adjust the space between the panel module 100 and the protective plate 10. The protective plate 10 is fixed to bosses 110 formed on the chassis of the panel module 100 by bolts 12 passing through the spacers 20. In a further embodiment, the protective plate 10 is made from a plastic material.

In one exemplary embodiment, jigging holes 13 are formed on the protective plate 10 to move the protective plate 10 by a jig. Further, a center opening 14 may be made in the center of the protective plate 10 to save material and reduce the weight of the packaging. Additionally, attaching planes 15 may be formed on either side of the center opening for easy attachment of vacuum pads (now shown). In one exemplary embodiment, the attaching planes 15 may have an area of at least 90mm$^2$.

In yet another exemplary embodiment, an antistatic substance is coated on the entire surface of the protective plate 10 to protect the panel module from static electricity. Table 1 shows the effect of the antistatic coating on static electricity.

TABLE 1

| | Static electricity level. | |
|---|---|---|
| Surface treatment | Surface resistance | Surface electric potential when rubbed arbitrarily with packing material |
| No treatment | Greater than $10^{12}$ Ω/□ | 200-5000 V |
| With antistatic coating | Less than $10^{11}$ Ω/□ | Less than 100 V |

Table 1 shows evident differences in static electricity levels between packaging with antistatic treatment and no treatment.

TABLE 2

| | Sensitivity of electronic devices to static electricity. | |
|---|---|---|
| Device | Static electricity at breakdown (Volts) | Static electricity at breakdown (Energy) |
| MOSFET | 100~200 | 0.5~2.0 |
| EPROM | 100 | 0.5 |
| JPET | 140~7000 | 0.98~2.45 |
| OP-AMP | 190~2500 | 1.62~31.5 |
| CMOS | 250~3000 | 3.13~450 |
| BIPOLAR TRANSISTOR | 300~7000 | 4.5~2.45 |

As seen in the Table 2, static electricity influences the quality of the product in the case of a product not having antistatic treatment.

Figure 3:
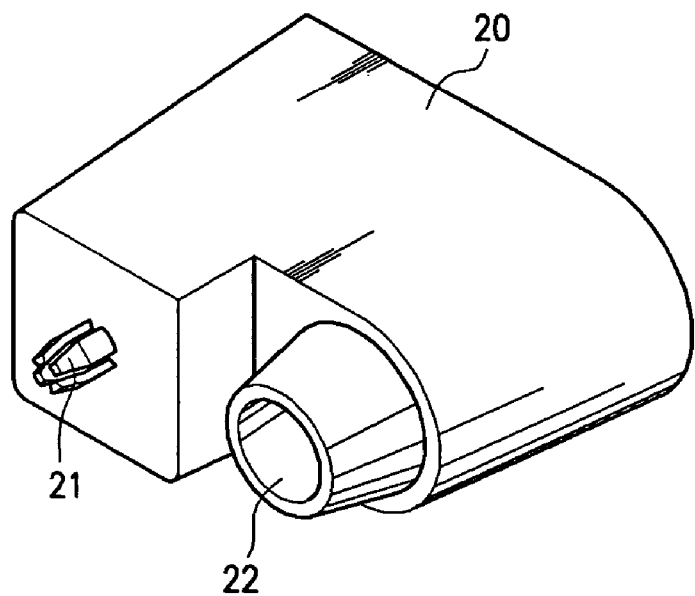
FIG. 3 is a perspective view of a spacer used for a packing equipment according to the exemplary embodiment of the present invention.

As shown in FIG. 3, the spacer 20 placed between the protective plate 10 and the panel module 100 has a hook 21 on one end, which can be releasably attached to an inserting hole 17 (FIG. 1) on the protective plate 10. A through hole 22 for a bolt 12 may be formed at a position on the spacer 20 corresponding to a bolting hole 18 in the protective plate 10.

Figure 4:
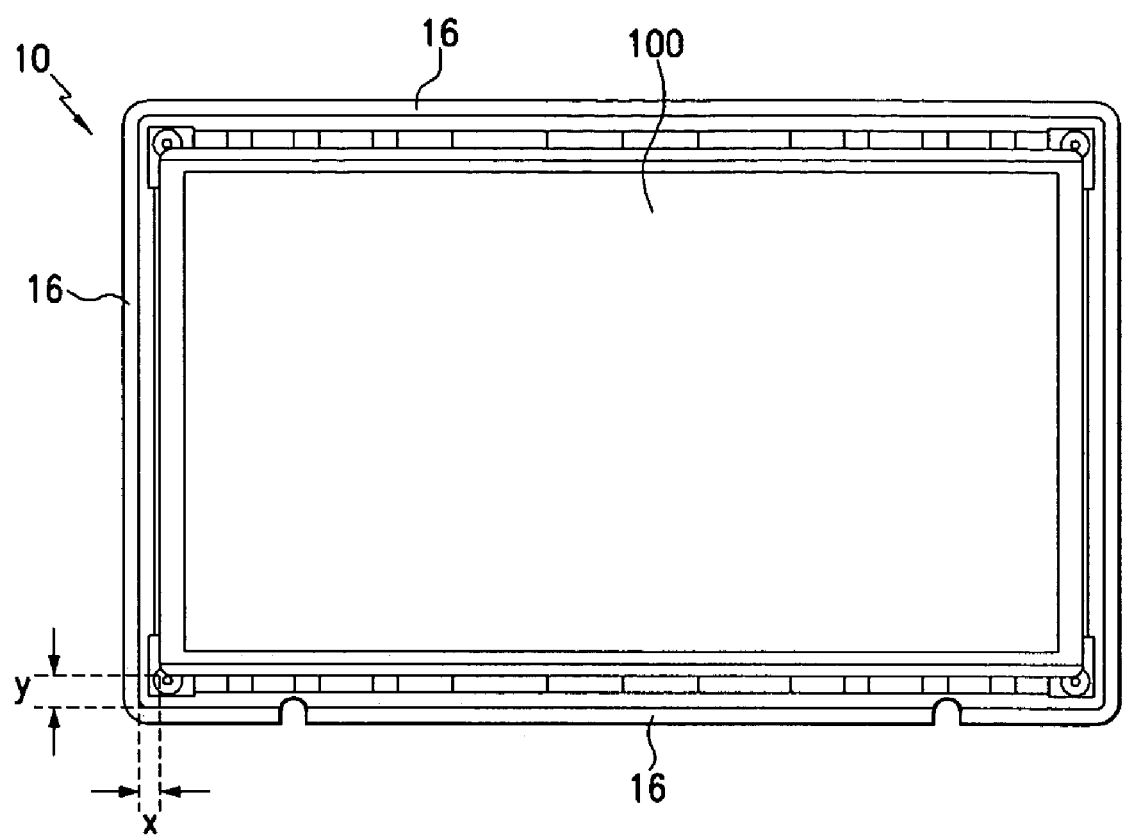
FIG. 4 is a plan view showing dimensions of packaging and a plasma display module according to an exemplary embodiment of the present invention.
Figure 5:
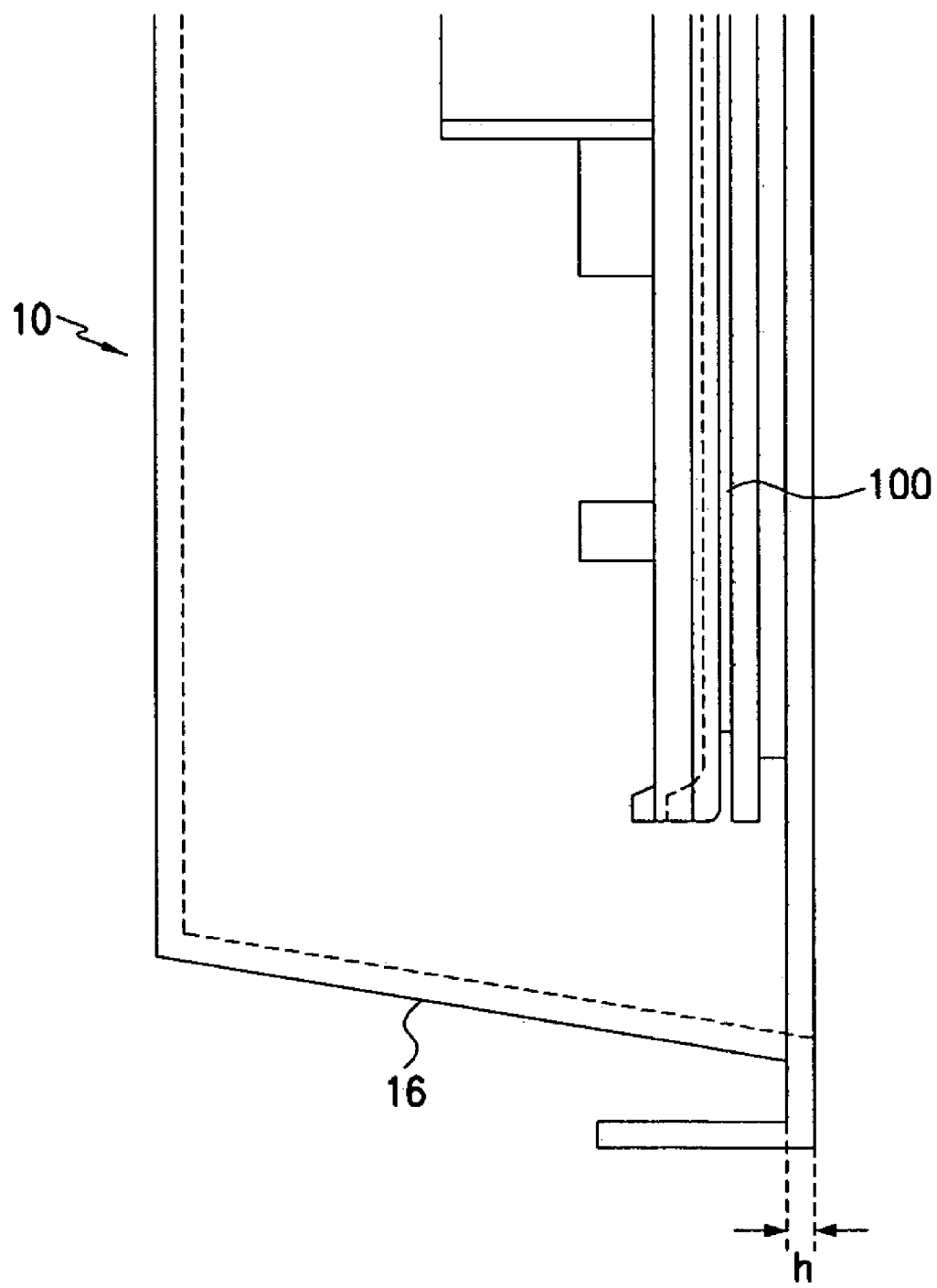
FIG. 5 is a schematic diagram of a side cross-section of packaging and a plasma display module according to an exemplary embodiment of the present invention.

FIG. 4 and FIG. 5 show sidewalls 16 formed on the periphery of the protective plate 10, wherein the sidewalls surround the sides of the panel module 100 for protection. In one exemplary embodiment, the sidewall 16 protrudes over the panel module 100 to a predetermined length h above the surface of the panel module. This allows a space between the sidewalls 16 of the protective plate 10 and the panel module 100.

The clearance allows the protective plate to absorb shocks imposed on it from outside and reduces or prevents the shock from being transferred to the panel module 100. In one exemplary embodiment, the clearance is set at least at 5mm.

The clearance in the horizontal and the vertical directions may be identical or they may be different. For example, as shown in FIG. 4, the clearance y in the horizontal direction is larger than the clearance x in the vertical direction because vibrations or droppage cause the displacement of the horizontal sidewall 16 supporting the whole weight of the panel module 100 to be greater than displacement of the vertical sidewall. Additionally, this allows for the horizontal dimension of the protective plate 10 to be minimized for the storage or transportation by a container.

Though typically panel modules 100 are about the same size, the bosses in panel modules 100 may vary in height depending on their position. Therefore, it is necessary to make spacers 20 with various heights. Thus, approximately sized spacers 20 may then be selected to attach the protective plate 10 to the panel module 100 and ensure that the sidewall 16 protrudes over the front surface of the panel module 100 by a desired amount.

In one exemplary embodiment, the protective plate 10 is fixed to the panel module 100 by the bolts 12. In a further embodiment, the bolt is put through the bolting hole 18 of the protective plate 10 and through the through hole 22 of the spacer 20 aligned to the boss 110 of the panel module 100, and tightened to the boss 110.

The bolt 12 may be flush headed so as not to protrude from the front surface of the protective plate 10. Furthermore, a stepped cavity 19 may be machined into the protective plate 10 to create a recessed area (for example, a countersink) around the bolting hole 18.

Figure 6:
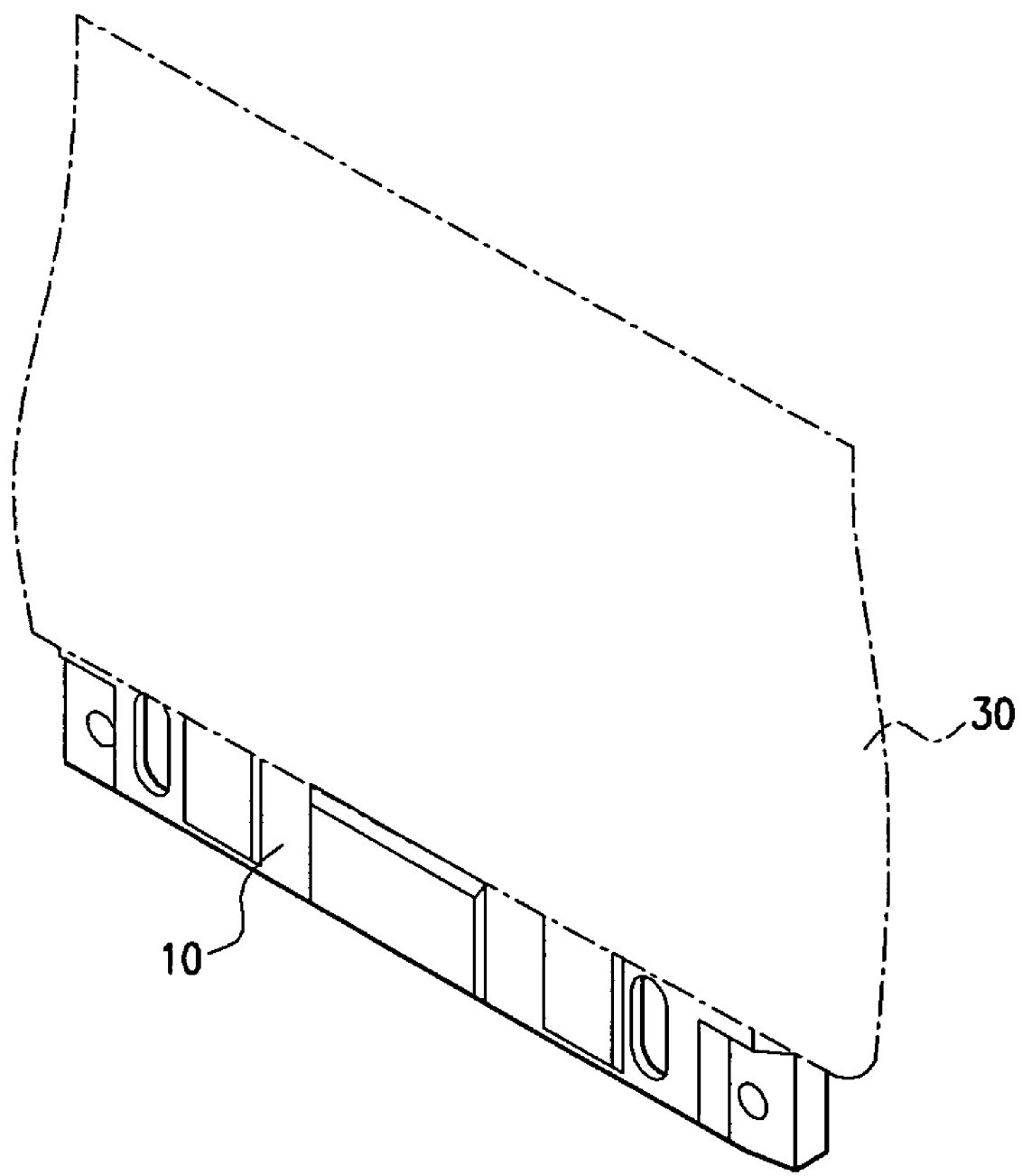
FIG. 6 is a perspective view of a plastic sheet covering a plasma display module according to an exemplary embodiment of the present invention.

In order to prevent the electrostatic injury to workers, the protective plate 10, as shown in FIG. 6, may be covered with a plastic sheet 30 which has been given antistatic treatment.

Figure 7A:
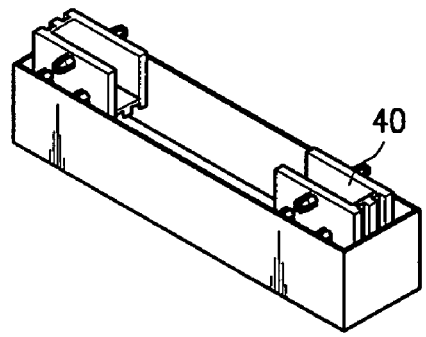
FIGS. 7a and 7b are perspective views of individual plasma display modules according to an exemplary embodiment of the present invention.
Figure 7B:
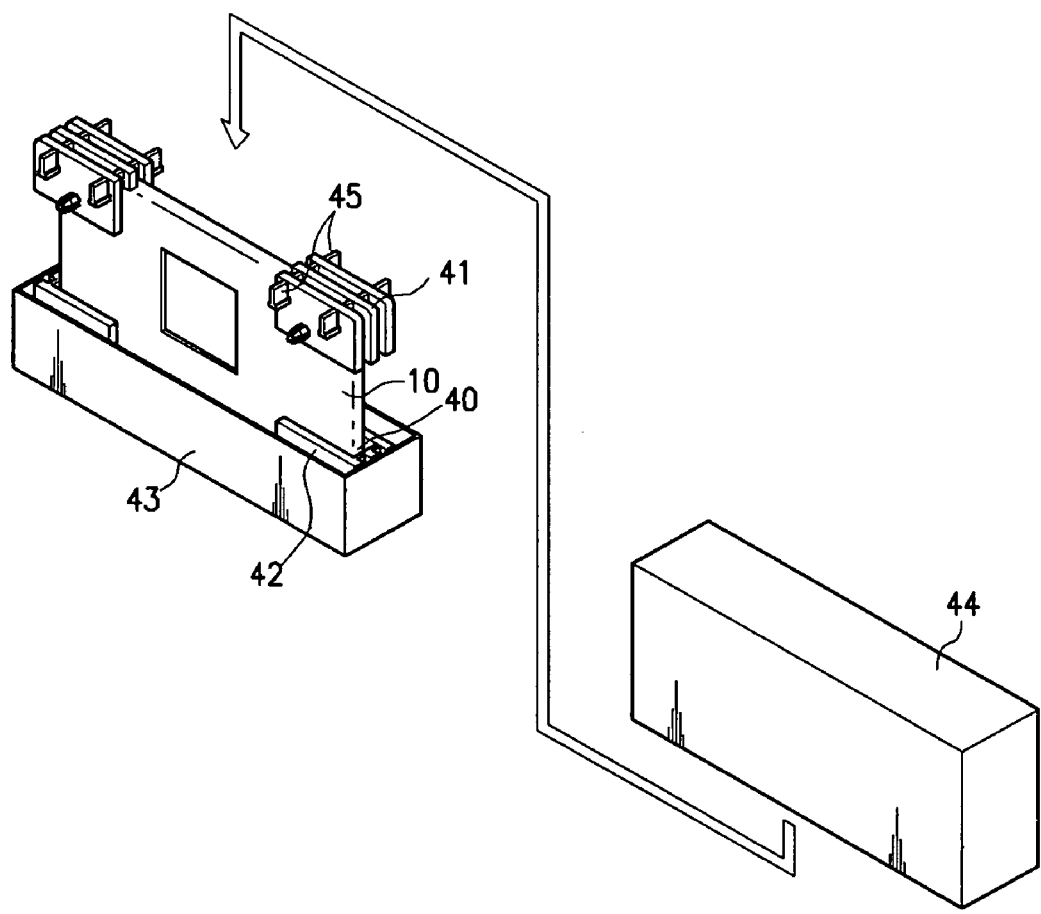

FIGS. 7a and 7b show packaging for individual panel modules, and FIG. 7b particularly shows packaging for a protective plate 11 affixed to a panel module.

In one embodiment, the packaging may include top and bottom shock absorbing means 41, 42 having a slot 40 therein. The shock absorbing means 41, 42 may be formed identically to the corner of the protective plate 11 to be inserted thereto. The shock absorbing means may be made from, for example, EPP, or any other appropriate material.

The packaging may also include a bottom box 43 in which the bottom shock absorbing means 42 are placed and a top box 44 that encompasses the bottom box 43. The bottom box 43 and the top box 44 may be made from, for example, corrugated cardboard or any other appropriate material.

Additionally, the top and bottom shock absorbing means 41, 42, may have supporting ribs 45 formed to contact the inner surfaces of the sidewalls of the top and bottom boxes 43, 44. The supporting ribs 45 provide space between the shock absorbing means 41, 42 and the boxes 43, 44, and prevent the protective plate 10 from being shaken inside.

In one embodiment, the packaging of a single panel module may occur as follows. The bottom shock absorbing means 42 may be placed in the bottom box 43 with their slots 40 facing up. The protective plate 11 may then be inserted into each slot 40 of the bottom shock absorbing means 42. Then the top shock absorbing means 41 may be put on top of the protective plate 11.

In one exemplary embodiment, the slot 40 formed in the shock absorbing means 41, 42 may be made in a single shape and a single size. This is because the panel module 100 is placed inside the protective plate 10 which has a constant shape, and only the protective plate 11 contacts the slot 40. Thus, each of the shock absorbing means 41, 42 and/or the top and bottom boxes 43, 44 may be a common size and shape which is applicable to various panel modules 100.

Figure 8A:
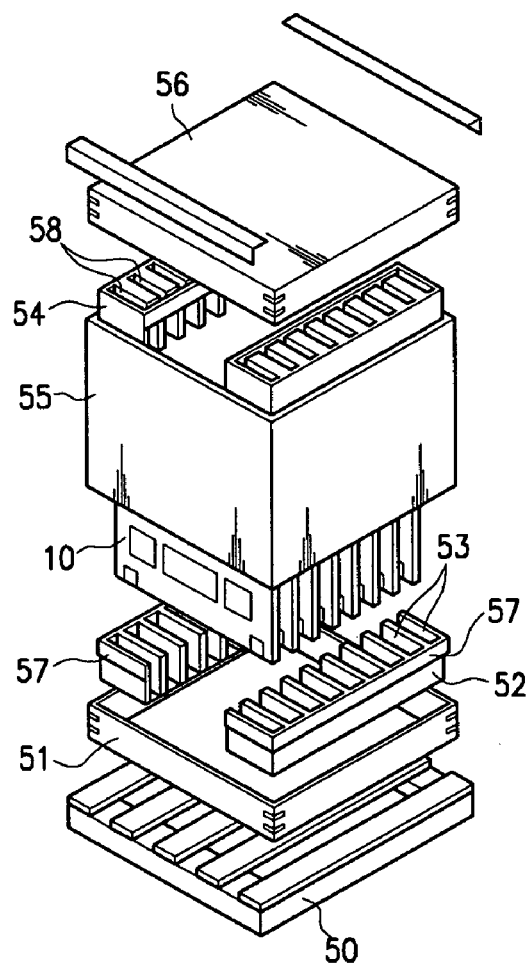
FIGS. 8a and 8b are perspective views of bundle packaging for a plurality of plasma display modules according to an exemplary embodiment of the present invention.
Figure 8B:
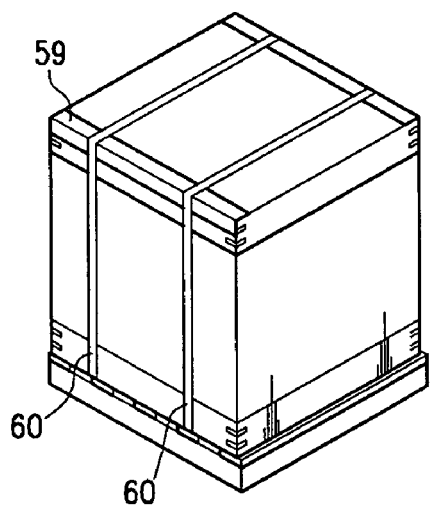

FIGS. 8a and 8b show a bundle packaging structure used to pack multiple protective plates containing panel modules. The bundle packaging may include a bottom box 51 laid on a pallet 50; and bottom shock absorbing means 52. The bottom shock absorbing means 52 may be placed along the edges of the bottom box 51 and may have a plurality of slots 53 spaced apart from each other and adapted to receive a protective plate 11 inserted thereto. Additionally, the bundle packing structure may include top shock absorbing means 54 which mirror the shape of the bottom shock absorbing means 52. In one embodiment, a side cover 55 may be fitted on the outer surface of the sidewall of the bottom box 51. The side cover 55 may extend to the top shock absorbing means 54. Further, the bundling packaging structure may include a top box 56 which encompasses the top shock absorbing means 54 and at least part of the side cover 55. In one exemplary embodiment, the boxes 51, 56 may be made from corrugated cardboard and the shock absorbing means 52, 54 may be made from EPP. However any other suitable materials may be used.

In yet a further exemplary embodiment, a step 57 may be formed on each of the peripheral surfaces of the shock absorbing means 52 and 54, to guide the boxes 51, 56 for secure fitting. The height of the step 57 may be the same as the wall-thickness of the boxes 51, 56 which allows one surface of the step to contact to the side cover 55 and one surface to contact the appropriate box 51 or 56.

Figure 9:
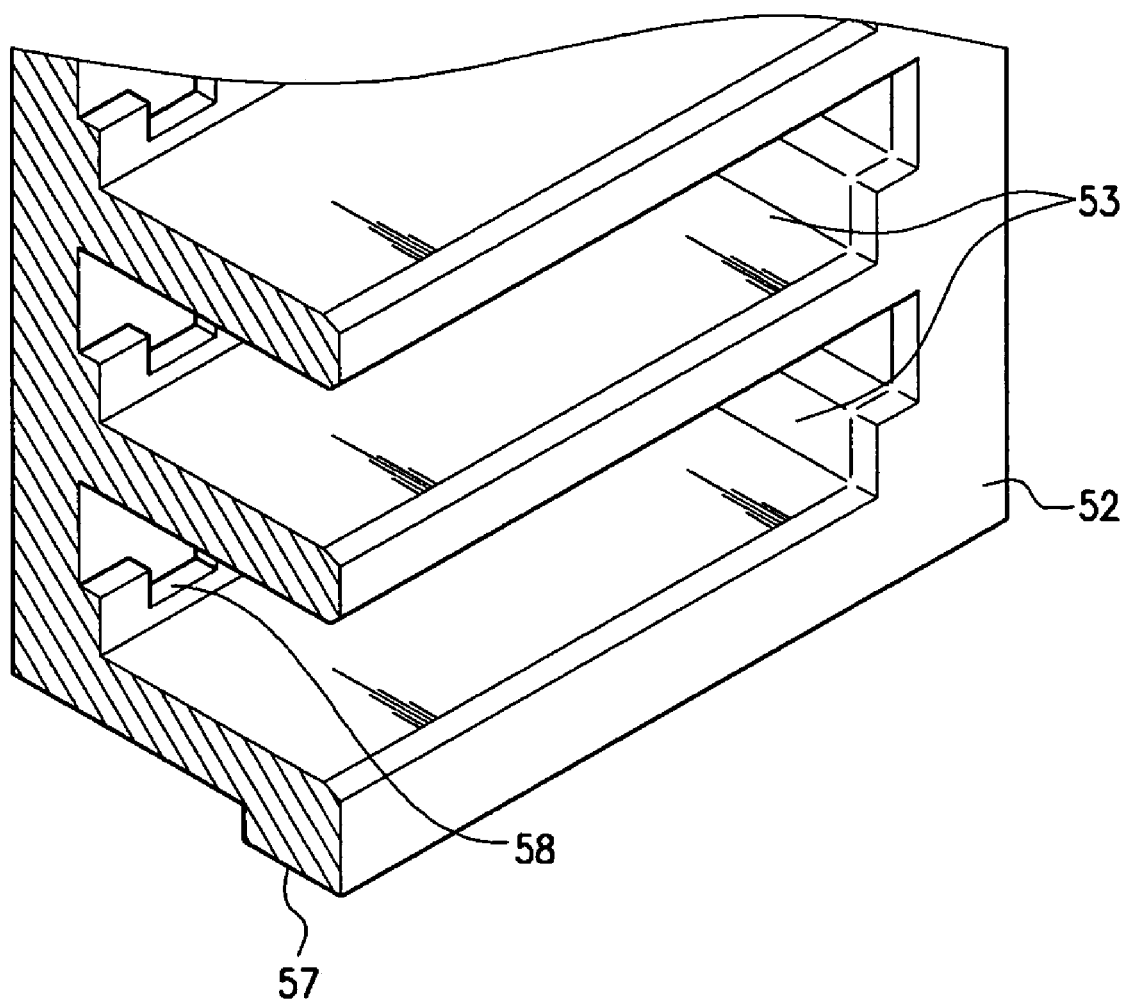
FIG. 9 is an enlarged partial perspective view, of the packaging shown in FIG. 8.

In another embodiment, as shown in FIG. 9, a groove 58 is formed on the inner and/or the outer surfaces of the slot 53 to dampen vibrations caused outside shocks.

In an exemplary embodiment, the bundle packaging process using a plurality of protective plates 11 may be as follows. The bottom box 51 is placed on the pallet 50 and the bottom shock absorbing means 52 are positioned at opposite sides of the bottom box 51 with the slots 53 facing up. In one embodiment, the stepped lower surface of the bottom shock absorbing means 52 is flush with the sidewall of the bottom box 51.

The flush surface provides firm contact between the side cover 55 and both the bottom box 51 and the bottom shock absorbing means 52.

Next, each protective plate 11 is, inserted into each slot 53 of the bottom shock absorbing means 52.

After the desired number of protective plates 11 have been inserted into the slots 53 of the bottom shock absorbing means 52, the side cover 55 is inserted over the bottom box 51.

Then, the top shock absorbing means 54 are placed on top of the protective plates 10 with the slots 53 facing downward. Finally, the top box 56 is put over the top shock absorbing means 54 and covers all of the protective plates 11.

The packing process may be completed by tying the pallet 50, the side cover 55 and the top box 56 together with bands 60 after putting protection pads 59 on the edges of the top box 56. The protection pads 59 may aid in preventing damage to the packaging caused by the bands 60.

As explained hereinabove, the protective plate according to the embodiment of the present invention protects the sides, front and back of the panel module from shocks outside and makes the secure transportation possible with the packing equipment.

Furthermore, the protective plate can be a common part applicable to the panel modules regardless of the shape of the panel modules. Accordingly, it is possible to save the cost by mass production of the protective plate 10 and to work efficiently.

Although exemplary embodiments of the present invention have been described in detail hereinabove, it should be clearly understood that many variations and/or modifications of the basic inventive concept herein taught which may appear to those skilled in the art will still fall within the spirit and scope of the present invention, as defined in the appended claims.

What is claimed is:

1. A packaging for a display module comprising:
a protective plate attachable to a back of a panel module, the panel module including a display panel, a chassis member and one or more circuit boards, the protective plate encompassing and protecting the back and sides of the panel module; and
spacers placeable between the protective plate and the chassis member of the panel module, the spacers providing a clearance between the protective plate and the chassis member of the panel module;
wherein the protective plate has at least one bolting hole for receiving a bolt for coupling the panel module to the protective plate and at least one inserting hole for receiving and coupling the spacer to the protective plate.

2. The packaging of claim 1, further comprising an antistatic plastic sheet covering the protective plate.

3. The packaging of claim 1, wherein an area surrounding the bolting hole is a countersink.

4. The packaging of claim 1, wherein the spacers have varying heights.

5. The packaging of claim 1, wherein the protective plate is made of plastic material containing an antistatic substance.

6. The packaging of claim 1, wherein the protective plate is made of plastic material having an antistatic substance coated on a surface.

7. The packaging of claim 1, wherein the protective plate has sidewalls along its periphery, the sidewalls protruding above a front surface of the panel module.

8. The packaging of claim 7, wherein the sidewalls of the protective plate are spaced from the panel module such that there is clearance between an inner surface of the sidewalls and the panel module.

9. The packaging of claim 8, wherein the clearance in a horizontal direction is larger than the clearance in a vertical direction.

10. The packaging of claim 1, wherein a plurality of reinforcing ribs are on the protective plate.

11. The packaging of claim 1, wherein the spacer includes:
a hook on one end thereof, the hook being releasably attachable to the inserting hole; and a through hole adapted to receive a bolt.

12. The packaging of claim 11, wherein the through hole is alianable with the bolting hole on the protective plate.

13. The packaging of claim 1 wherein the protective plate has jigging holes to allow the protective plate to be moved by a jig.

14. The packaging of claim 1, wherein the display module is a plasma display module.

15. A packaging for packing an individual display module comprising:
a protective plate attachable to a back of the panel module, the panel module including a display panel, a chassis member and one or more circuit boards, the protective plate having a first end and a second end distally parallel to the first end, and sidewalls between the first end and the second end encompassing and protecting the back and sides of the panel module;
first shock absorbing means having a plurality of first shock absorbing slots spaced from each other, each first shock absorbing slot located between a first plurality of substantially parallel plates coupled by a pair of first supporting ribs transverse to the first plurality of substantially parallel plates and adapted to receive a first corner of the protective plate; and
second shock absorbing means having a plurality of second shock absorbing slots spaced from each other, each second shock absorbing slot located between a second plurality of substantially parallel plates coupled by a pair of second supporting ribs transverse to the second plurality of substantially parallel plates and adapted to receive a second corner of the protective plate.

16. The packaging of claim 15 further comprising:
a first box into which the first shock absorbing means are insertable; and
a second box into which the second shock absorbing means are insertable, the second box encompassing at least an external edge of the first box.

17. The packaging of claim 15, wherein the shock absorbing means are made of expanded polypropylene.

18. The packaging of claim 15 wherein the display module is a plasma display module.

19. A packaging for a plurality of display modules comprising:
a protective plate attachable to a back of each panel module, the panel modules including a display panel, a chassis member and one or more circuit boards, the protective plate having a first end and a second end distally parallel to the first end, and sidewalls between the first end and the second end encompassing and protecting the back and sides of the panel module;
first shock absorbing means having a plurality of first slots spaced from each other, each first slot adapted to receive a first end of the protective plate;
a first box into which the first shock absorbing means are insertable, the first box having a first box external edge and first box sidewalls;
second shock absorbing means having a plurality of second slots spaced from each other, each second slot adapted to receive a second end of the protective plate;
a second box into which the second shock absorbing means are insertable, the second box having a second box external edge; and
a side cover encompassing the plurality of protective plates and being located between the first box external edge and the second box external edge;
wherein the first shock absorbing means comprises a peripheral step adapted to abut the first box sidewalls.

20. The packaging of claim 19, further comprising a groove on a wall of each first slot to dampen outside vibrations.

21. The packaging of claim 19, wherein the shock absorbing means are made of expanded polypropylene.

22. The packaging of claim 19, wherein the display module is a plasma display module.

* * * * *

UNITED STATES PATENT AND TRADEMARK OFFICE
CERTIFICATE OF CORRECTION

PATENT NO. : 7,457,130 B2  
APPLICATION NO. : 10/930412  
DATED : November 25, 2008  
INVENTOR(S) : Myoung-kon Kim Page 1 of 1

It is certified that error appears in the above-identified patent and that said Letters Patent is hereby corrected as shown below:

Column 7, line 44, Claim 12   Delete "alianable",  
Insert --alignable--

Signed and Sealed this

Twenty-first Day of April, 2009

JOHN DOLL  
*Acting Director of the United States Patent and Trademark Office*